(12) United States Patent
Sirito-Olivier (10) Patent No.: US 6,388,531 B1
(45) Date of Patent: May 14, 2002

(54) VOLTAGE CONTROLLED OSCILLATOR WITH REDUCED PARASITIC INTERFERENCE

(75) Inventor: Philippe Sirito-Olivier, St Egreve (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/707,376

(22) Filed: Nov. 7, 2000

(30) Foreign Application Priority Data

Nov. 9, 1999 (FR) .............................. 99 14055

(51) Int. Cl.⁷ .................... H03L 7/085; H03L 7/089
(52) U.S. Cl. ............... 331/17; 331/1 A; 331/15; 331/25; 327/156; 327/157; 327/159
(58) Field of Search .................. 331/1 A, 8, 15, 331/17, 18, 25; 327/156–159

(56) References Cited

U.S. PATENT DOCUMENTS

| | | | |
|---|---|---|---|
| 4,814,726 A | 3/1989 | Byrd et al. | 331/1 A |
| 5,036,216 A | 7/1991 | Hohmann et al. | 309/269 |
| 5,485,125 A | 1/1996 | Dufour | 331/17 |
| 5,699,387 A | 12/1997 | Seto et al. | 375/376 |
| 5,898,328 A | 4/1999 | Shoji | 327/157 |
| 5,949,264 A | 9/1999 | Lo | 327/157 |
| 6,278,333 B1 * | 8/2001 | Le et al. | 331/17 |

* cited by examiner

*Primary Examiner*—David Mis
(74) *Attorney, Agent, or Firm*—Lisa K. Jorgenson; Allen, Dyer, Doppelt, Milbrath & Gilchrist, P.A.

(57) ABSTRACT

A phase locked loop for a voltage controlled oscillator includes a phase comparator receiving at its inputs a reference frequency signal and a frequency signal from the oscillator, and supplies logic values to command a charge pump. A charge re-injection circuit receives one of the inputs of the comparator and supplies a logic value to command the charge pump. The loop further includes a detector with a threshold value for a current representative of the current supplied by the charge pump. A logic output from the detector is applied to the charge re-injection circuit so that the duration of the charge re-injection is limited.

31 Claims, 12 Drawing Sheets

VOLTAGE CONTROLLED OSCILLATOR WITH REDUCED PARASITIC INTERFERENCE

FIELD OF THE INVENTION

The invention relates to the field of digital phase locked loops, and, more particularly, to a method and device for reducing the level of parasitic lines from an oscillator controlled by a phase locked loop.

BACKGROUND OF THE INVENTION

Phase locked loops (PLL) are used, for example, every time there is a need to create a frequency in an electronic apparatus having a specified value that remains stable over time. Information on the design of such circuits is available in a book by Ulrich L. Rohde titled "Digital PLL Frequency Synthesizers—Theory and Design", published by Prentice Hall Inc., Englewood Cliffs, N.J., 07632, under reference No. ISBN 0-13 21439-2. Such a device is used to generate a high frequency signal in a precise and controlled manner, such as from 100 MHz to several GHz, for example.

Figure 1:
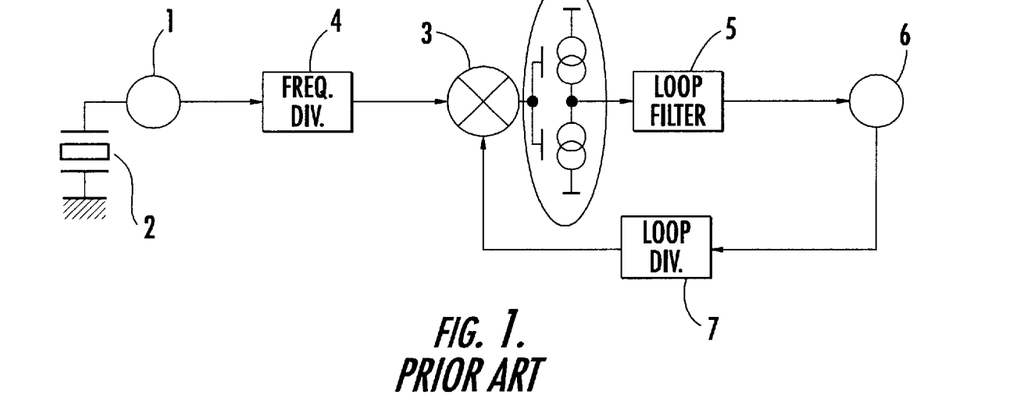
FIG. 1 illustrates a phase locked loop for a voltage controlled oscillator in accordance with the prior art.

FIG. 1 shows the traditional structure of a digital phase locked loop. A reference signal Fref, generally coming from an oscillator 1 controlled by a quartz crystal 2, is applied to a phase comparator 3 via a frequency divider 4. The phase comparator 3 is the heart of the PLL, and controls a voltage controlled oscillator VCO 6 via a loop filter 5. The signal coming from the VCO 6 is generally applied via a loop divider 7 to the comparator 3, which sends the signal again around the loop. The signal may be from the VCO 6 or an intermediate signal from the loop divider 7.

By adjusting the division ranking and the reference and loop dividers, the frequency of the output signal can be changed. The output signal frequency is then fed back to control the reference frequency Fref. The spectral frequency and the stability of the output signal are fixed by the characteristics of the loop and by the performance of the reference signal.

With regard to the traditional structure of the PLL illustrated in FIG. 1, particular interest will now be directed to the circuit connected to the output of the phase comparator 3. Ways of creating a phase comparator circuit are given, for example, in the above referenced book by Rohde, particularly on page 11.

The phase frequency comparator or detector (PFD), which may be called a three state comparator, has one state where the phase of the VCO is delayed with respect to the reference phase, one state where the phase of the VCO is in advance of the reference phase, and another state called the equilibrium state where these phases are in phase or within areas of phase advance or phase delay for which the phase loop is not able to react.

The three state phase frequency comparator has the best performance with respect to capture and linearity, and is the phase comparator that is most often used. This PFD is generally connected to a charge pump 16 whose role is to supply a current related to the relative situation of the inputs to the comparator, Fref and FVCO.

Figure 2:
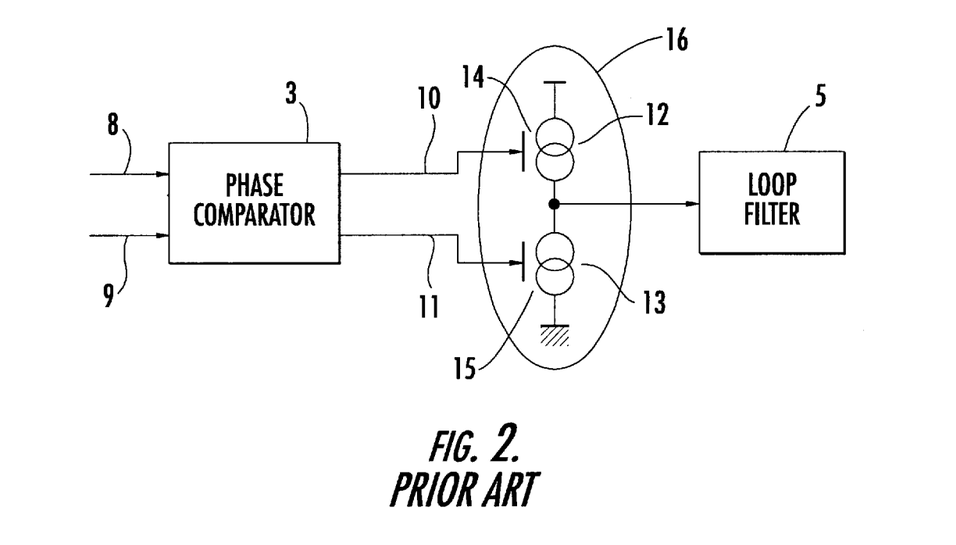
FIG. 2 illustrates in greater detail the phase comparator and charge pump illustrated in FIG. 1.

FIG. 2 represents in greater detail the phase comparator 3 and a charge pump circuit 16 connected immediately at an output thereof. The phase comparator 3 includes a first 8 and a second 9 input for receiving respectively the reference frequency Fref and a frequency $F_{VCO}$ coming from the VCO. The phase comparator 3 includes two logic outputs 10, 11 respectively called up and down. These outputs 10, 11 control current generators 12, 13 via respective control inputs 14 and 15.

The current generators 12, 13 together form the charge pump 16 of the voltage controlled oscillator 6. The generators 12, 13 supply current that are in principle equal, but in the opposite direction. Because of the manufacturing tolerances, an imbalance generally exists between the absolute values of the currents supplied by the generators 12 and 13.

Figure 3:
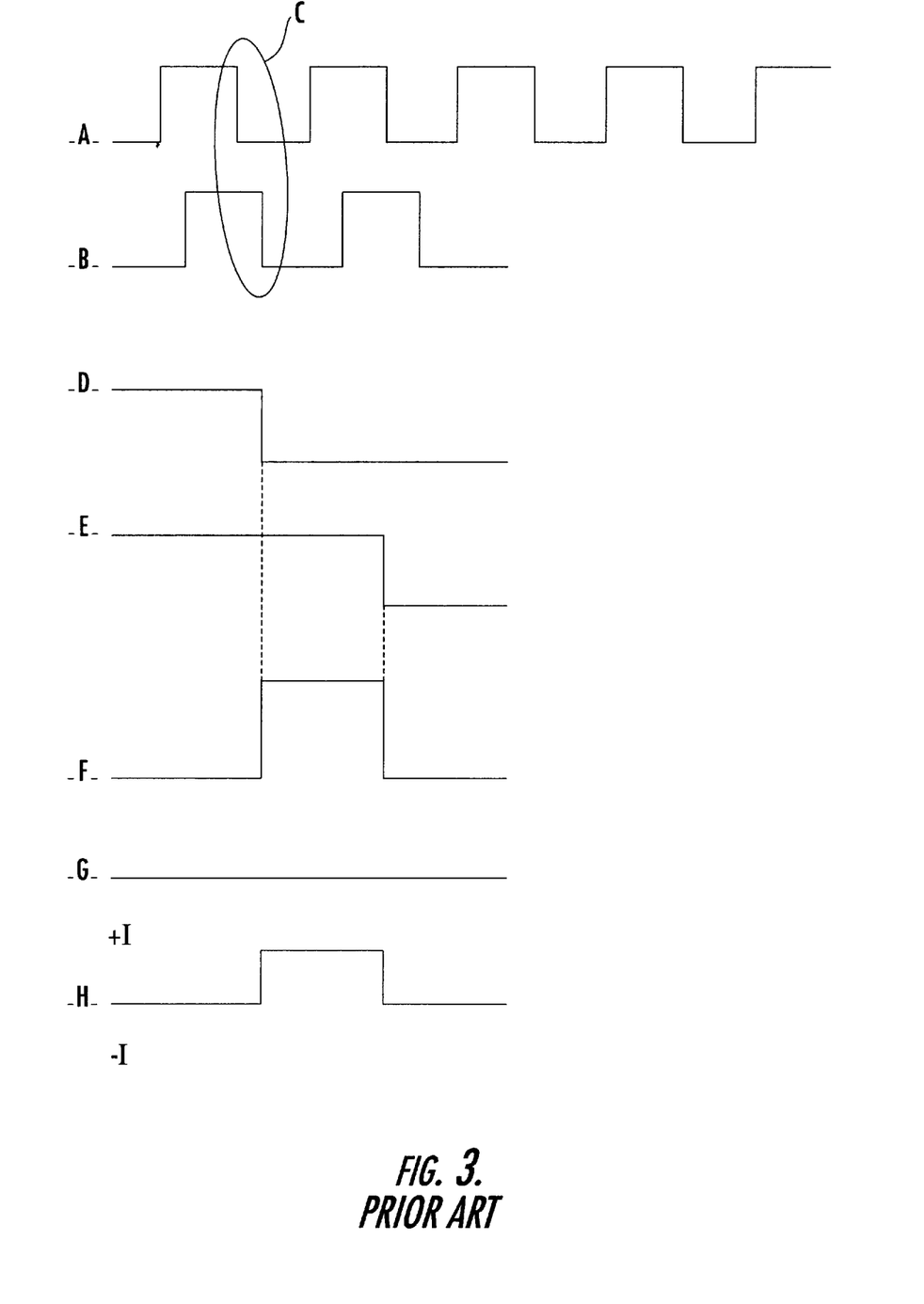
FIGS. 3, 4 and 5 respectively illustrate changes in the signals over time in accordance with the prior art.

The operation of this circuit will now be explained with reference to FIGS. 3 to 5, which represent different signals. The signals represented by lines A and B in FIG. 3 represent the form of periodic square signals obtained in a known way from frequencies generated by the reference oscillator 1 and the VCO 6.

In the example shown, for lines A and B the falling edge of the VCO signal is delayed with respect to the rising edge corresponding to the Fref signal, as shown within the ring C. An enlarged view of the temporal relationship between these two edges is shown by lines D and E. The value on the logic outputs 10 and 11 is represented on lines F and G respectively. The charge pump 16 current is shown by line H. This may be a positive current of value +I, a negative current of value −I, or a zero current if neither or both of the two current generators 12 and 13 produce current.

A falling edge for the Fref frequency arriving before the falling edge of the VCO frequency will generate the up output 10 (line F) having logic value 1, for example, commanding generator 12 to supply current. The arrival of the falling edge of the VCO frequency (line E) will generate the output 10 of the comparator 3 having a logic value 0, for example, commanding the generator 12 to switch off. Generator 12 will thus charge the pump for a period of time equal to the phase delay between $F_{VCO}$ and Fref. This charging has the effect of bringing the phase delay back to 0.

Figure 4:
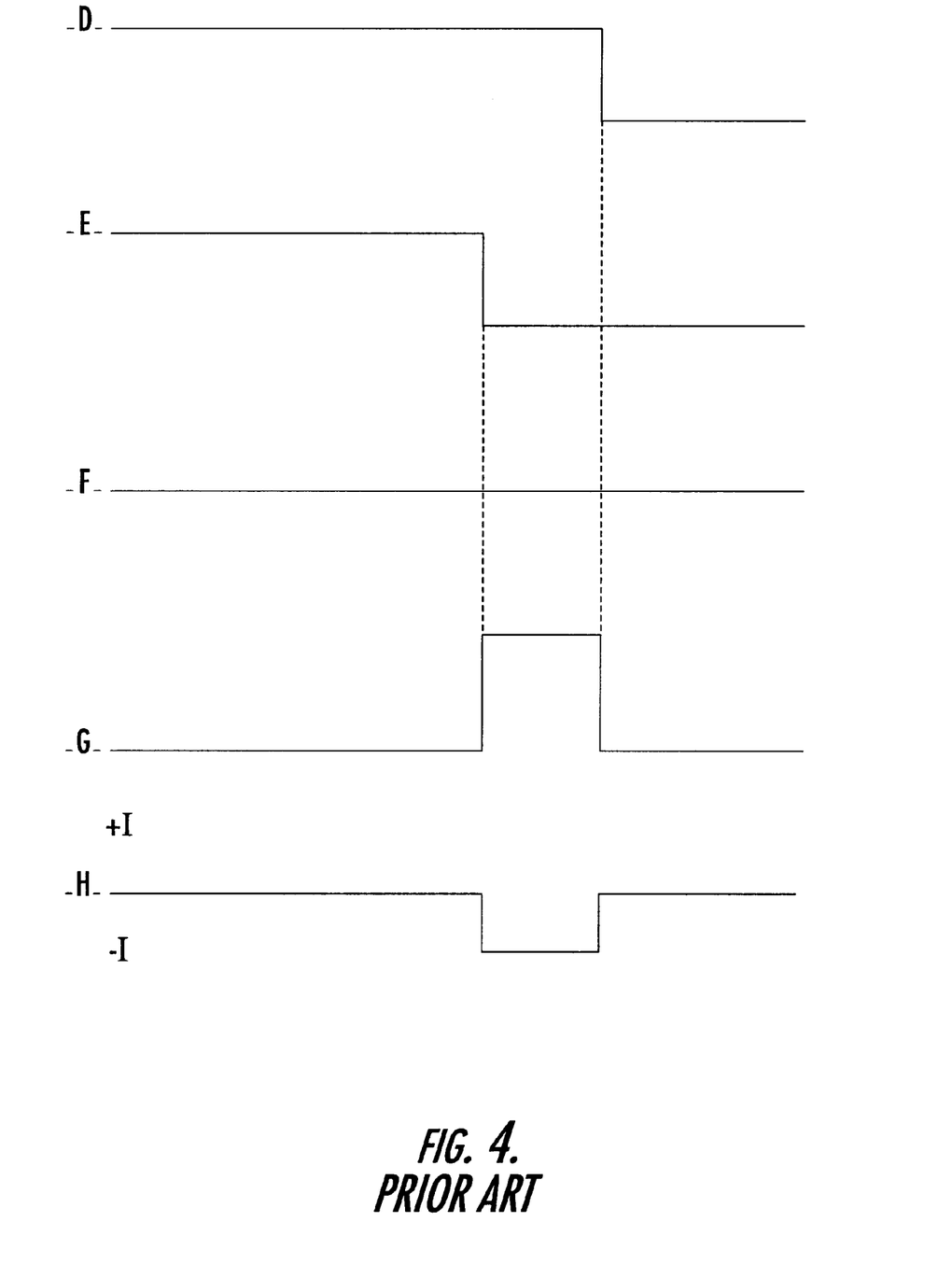
Figure 5:
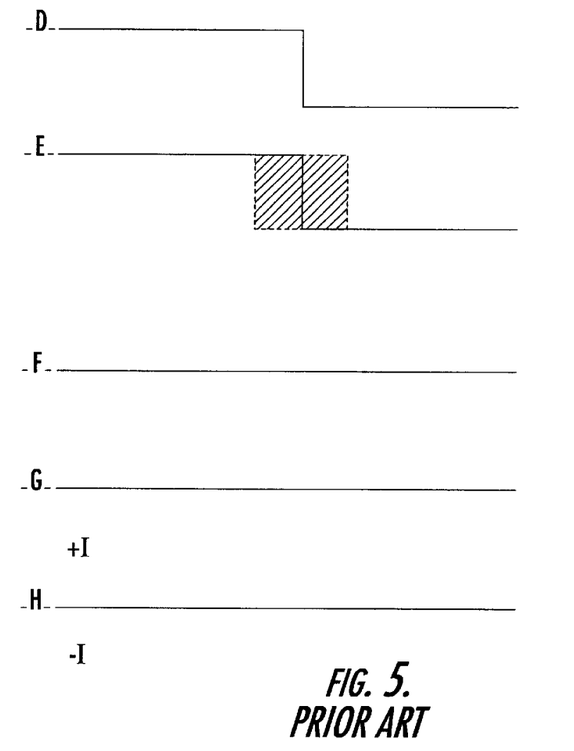

Referring now to FIGS. 4 and 5, what occurs when the frequency $F_{VCO}$ is in advance or in phase with respect to the frequency Fref will now be examined. In FIG. 4, the falling edge of the signal $F_{VCO}$ represented by line E arrives before the falling edge of the signal Fref represented by D. Under these conditions, the operation of the comparator 3 is such that the falling edge of signal $F_{VCO}$ will cause a change in the logic value present at output 11 (line G) of the comparator 3. This value is set at 1, for example.

This output will generate the command 15 for the generator 13. A current in the opposite direction to that in the preceding case, as mentioned in connection with FIG. 3, will be passing through the charge pump 16. The subsequent arrival of the falling edge of the Fref signal will cause the logic value at output 11 (down) from the comparator 3 to return to the previous logic value 0, for example, which is line G in FIG. 4. Hence the current flow from generator 13 (line H) is stopped.

In FIG. 5, the signals Fref and $F_{VCO}$, i.e., lines D and E are in phase. Under these conditions, the logic values on outputs 10 and 11, i.e., lines F and G, do not change. The current I, i.e., line H, is zero. The operation which has just been described in connection with FIGS. 3 to 5 does not discuss reaction times of the phase comparator 3 which will be referred to as Tpfd, and the reaction times of the current generators will be referred to as Tcp. Due to these reaction times there are phase delay and advance areas close to the area referred to as the equilibrium area represented in FIG. 5. This is where the Fref and $F_{VCO}$ phases are in phase, and wherein the comparator 3 and the pump 16 do not have time to react.

In FIG. 5, the situation is shown in which the delay of the falling edge of signal $F_{VCO}$ is slightly delayed or slightly in advance of the falling edge of the Fref signal and is situated, for example, within the hatched area shown in E in FIG. 5. This hatched area in FIG. 5 corresponds to double the minimum time required to start the flow of current from generator 12 or 13.

Figure 6:
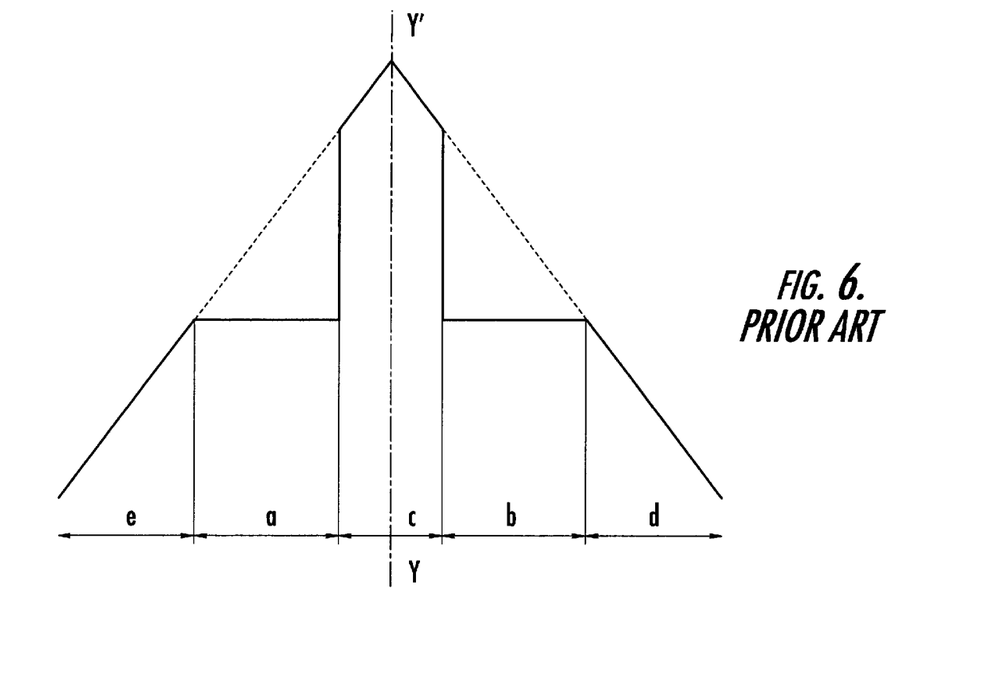
FIG. 6 illustrates the frequency spectrum at the output from the VCO when the phase locked loop does not include a charge re-injector circuit in accordance with the prior art.

Within the time interval represented by the hatched area, the charge pump 16 has not yet reacted to the command provide current when it receives the command to stop providing current. Hence, with regard to the control exerted on the frequency $F_{VCO}$ by the phase locked loop, the result illustrated by the curve shown in FIG. 6 is obtained. This curve shows the output power on the y-axis as a function of the frequency on the x-axis. This curve also shows two plateau areas, substantially symmetrical to one another with respect to an axis YY', corresponding to the value $F_{VCO}$.

A frequency range marked C, for which the axis YY' is an axis of symmetry, corresponds to an area where, due to reactions times Tpfd and Tcp, no control is exerted over the output frequency $F_{VCO}$. The frequency areas marked a and b in FIG. 6 correspond to areas where, because of the phase control loop, the operation of the VCO will be servo-driven in a stable fashion. Areas d and e, positioned in a substantially symmetrical fashion with respect to one another, correspond once again to frequency ranges where regulation is no longer exercised.

In the uncontrolled areas c and d and e, the output power is regulated by the characteristics of the oscillator VCO 6. The operation of the loop which has just been described leads to strong phase noise in the area c around the central frequency $V_{VCO}$. This forms a major defect in many applications. One known aproach to remedy this defect includes re-injecting, in a systematic way, a current pulse of predetermined duration triggered by the falling edge of Fref. This re-injection takes place on the slowest path triggered by Fref, and the duration is fixed by design to ensure a current pulse regardless of the conditions of use of the phase locked loop.

Figure 7:
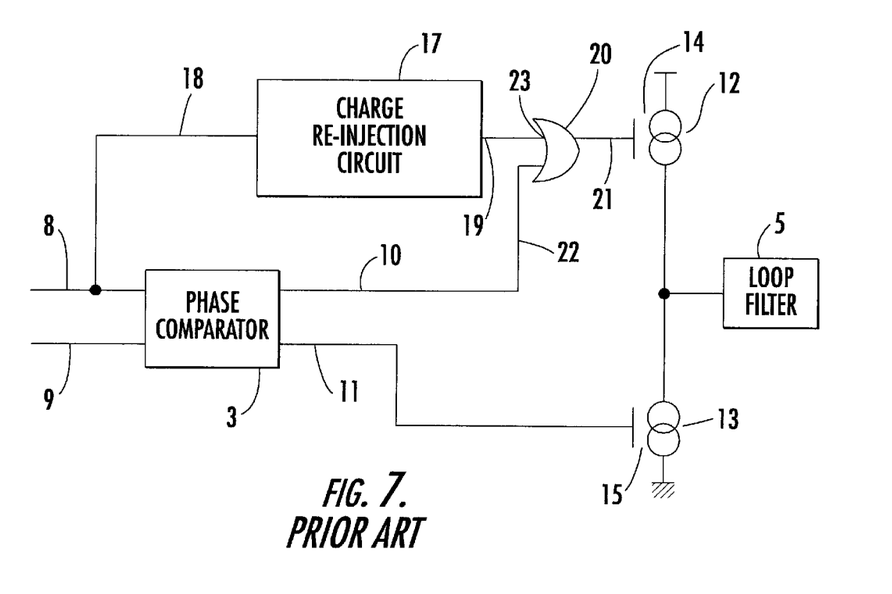
FIG. 7 illustrates in greater detail the phase comparator, charge pump and a charge re-injection circuit in accordance with the prior art.

A diagram showing an example of a circuit used for the re-injection is shown in FIG. 7. Compared with the circuit shown in connection with FIG. 2, the known re-injection circuit intended to avoid the uncontrolled area c comprises a charge re-injection circuit 17 in the form of a generator which generates a pulse of predetermined duration.

An input 18 to this generator 17 receives Fref, and an output 19 carrying the output pulse supplies a first input 23 to an OR gate 20. A second input 22 to this gate receives the output (up) from the comparator 3. An output 21 from the OR gate 20 commands the current generator 12. Hence, the current generator 12 is commanded to pass the pulse supplied by the pulse generator 17 for at least the duration q of the pulse.

Figure 8:
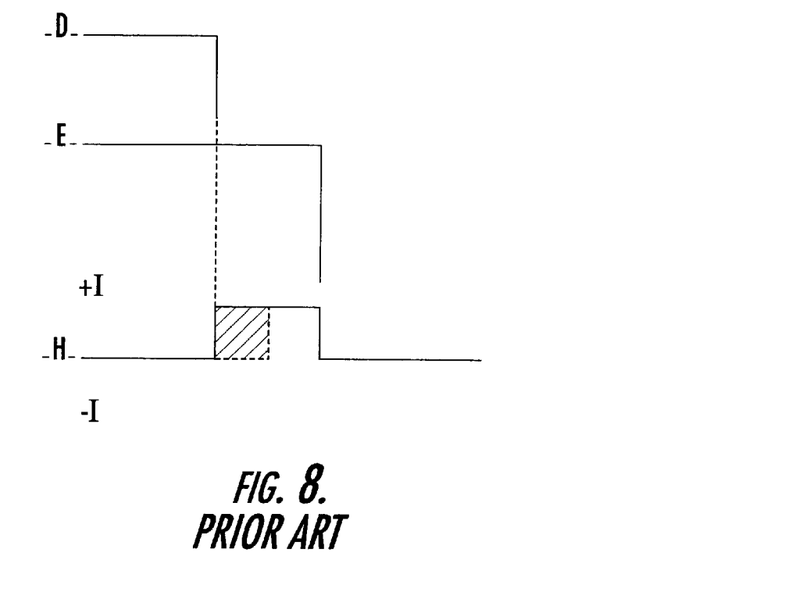
FIGS. 8 to 10 respectively illustrate changes in the signals over time in accordance with the prior art.

The operation of this re-injection circuit will now be explained with reference to FIGS. 8 to 10. These figures use the same annotations as those used in FIGS. 3 to 5. FIG. 8 represents the case where the phase delay of the signal $F_{VCO}$ is greater than the duration q represented by a hatched area on line H of the pulse supplied by the pulse generator 17. In this case, the current generator 12 will be commanded to pass current by the two inputs of the OR gate 20. The flow time of generator 12 due to the pulse from generator 17 is less than the flow time necessary to come back into phase. The operation is identical to that described in connection with FIG. 3. The pulse of duration q changes nothing.

In the case shown in FIG. 9 where the frequency $F_{VCO}$ is phase advanced by a period of time d with respect to Vref, one will have an operation identical to that described in connection with FIG. 4. There will be a triggering of a discharge current from generator 13 for the duration of the phase displacement. However, the arrival of the falling edge Fref will trigger the pulse generator 17. This will cause a charge current for the duration q of the pulse. The phase loop will operate in such a way that the mean sum of the negative current and the positive current recenters the loop to obtain the frequency $F_{VCO}$.

Figure 10:
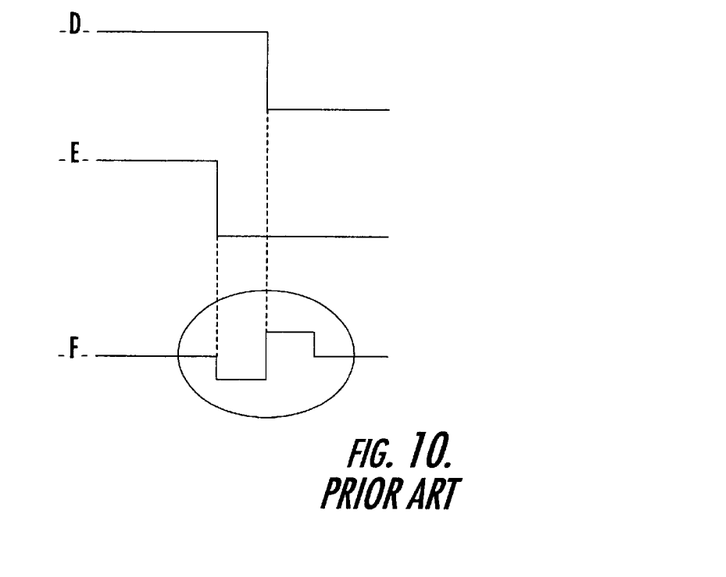

When in the area of equilibrium as FIG. 10 shows, the current is present in an alternating way in generators 12 and 13 so that there is an oscillation at frequency Fref. The spectrum then has the throughput shown in FIG. 11. There is a power peak at frequency $F_{VCO}$, and in addition, peaks repeated at frequency intervals separated by the value of the frequency Fref. These peaks are a nuisance since, for example, they interfere with adjacent channels.

The inventor has noted that the parasitic peaks are separated from one another by intervals equal to the value of the frequency Fref, and have an amplitude which increases with the duration of charge. The invention therefore reduces as much as possible the charge duration, and hence, the amplitude of the variation of the charge which is proportional to the duration q of the pulse generated by the generator 17. In this way, the amplitude of the peaks that are parasitic to the frequency Fref are reduced. The duration q of the pulse from the generator 17 according to the prior art and shown in FIG. 7 must be greater than the reaction time $T_{PFD}$ of the phase comparator 3 increased by the reaction time $T_{CP}$ of the current generator 12 or 13.

To obtain this result regardless of the operating conditions, a value greater than this reaction time is determined on several samples under laboratory conditions. Then, to be sure that the duration q remains greater than the reaction time under the most unfavorable conditions, the minimum time determined is multiplied by a factor of between 5 and 10. The most unfavorable conditions include temperature extremes, components at extreme tolerance limits, and variation of power supply voltages, for example. In most cases, the result is that it is possible to reduce the time q, and hence, reduce the intensity of the peaks parasitic to the frequency Fref.

The reaction time of the phase locked loop is, as has already been explained above, the time which passes between the arrival of the charge command and the moment when the charge current generator passes a significant level of current. Therefore, a detector of the current passed by the charge current generator is put into place. The detector changes the logic level when the value of the current generated by the current generator becomes greater than a threshold value, and the changing of this logic value will be used to change the logic level at the output of the pulse generator.

Despite the additional transit times due to the reaction times of the detector and any possible additional circuits, an additional pulse duration time q will be obtained that is quasi-equal to the reaction time of the loop.

SUMMARY OF THE INVENTION

The present invention relates to a phase locked loop for a voltage controlled oscillator. The loop comprises a phase comparator receiving at its input a reference frequency and a frequency coming from the oscillator. Logic values are supplied to command a charge pump. A charge re-injection circuit receives one of the inputs from the comparator and supplies a logic value to command the charge pump. The phase locked loop further comprises a detector of a threshold value of a current representative of the current supplied by the charge pump. A logic output from the detector is applied on return to the charge re-injection circuit in a way that limits the duration of the charge re-injection.

The current detector could be coupled either to the current generator effectively included in the charge pump, or to an additional generator that is identical to the current generator included in the pump.

The approach with an additional generator has the disadvantage, due to manufacturing tolerances, of having a triggering threshold which can be slightly offset in time in relation to the triggering threshold of the generator included in the pump. To overcome this disadvantage, the threshold for the current value triggering the change of logic level of the detector could be fixed at a value slightly greater than the value that would be used for the generator in the pump. The advantage of the additional generator is that the presence of the detector and of the additional generator does not interfere with the operation of the charge pump.

In a particularly advantageous embodiment, the input to the charge re-injection circuit is not coupled to the input of the comparator receiving the reference frequency, but to the input of the comparator receiving the frequency from the output of the oscillator. This embodiment has the advantage of further reducing the value of the mean charge current so that the height of the parasitic peaks separated from one another by the value of the frequency Fref is reduced.

The invention also relates to a method in which the duration of the re-injection is limited, not as a function of the predetermined reaction time of the phase locked loop, but as a function of the instantaneous reaction time of the phase locked loop itself.

BRIEF DESCRIPTION OF THE DRAWINGS

A detailed embodiment example and a preferred embodiment comprising a variation will now be described with reference to the appended drawings in which.

DETAILED DESCRIPTION OF THE PREFERRED EMBODIMENTS

For the description of the circuits conforming to the invention, the elements having the same function as those described in connection with the known prior art will bear the same reference number. These elements will not necessarily be commented on again in the description which follows.

With regard to the circuit of the prior art described with reference to FIG. 7, the circuit according to the present invention further comprises a current detector 30 that receives the charge current supplied by the charge pump 16. In addition, a charge re-injection circuit 31 comprises an input 32 intended to limit the duration of the charge re-injection pulse.

Figure 12:
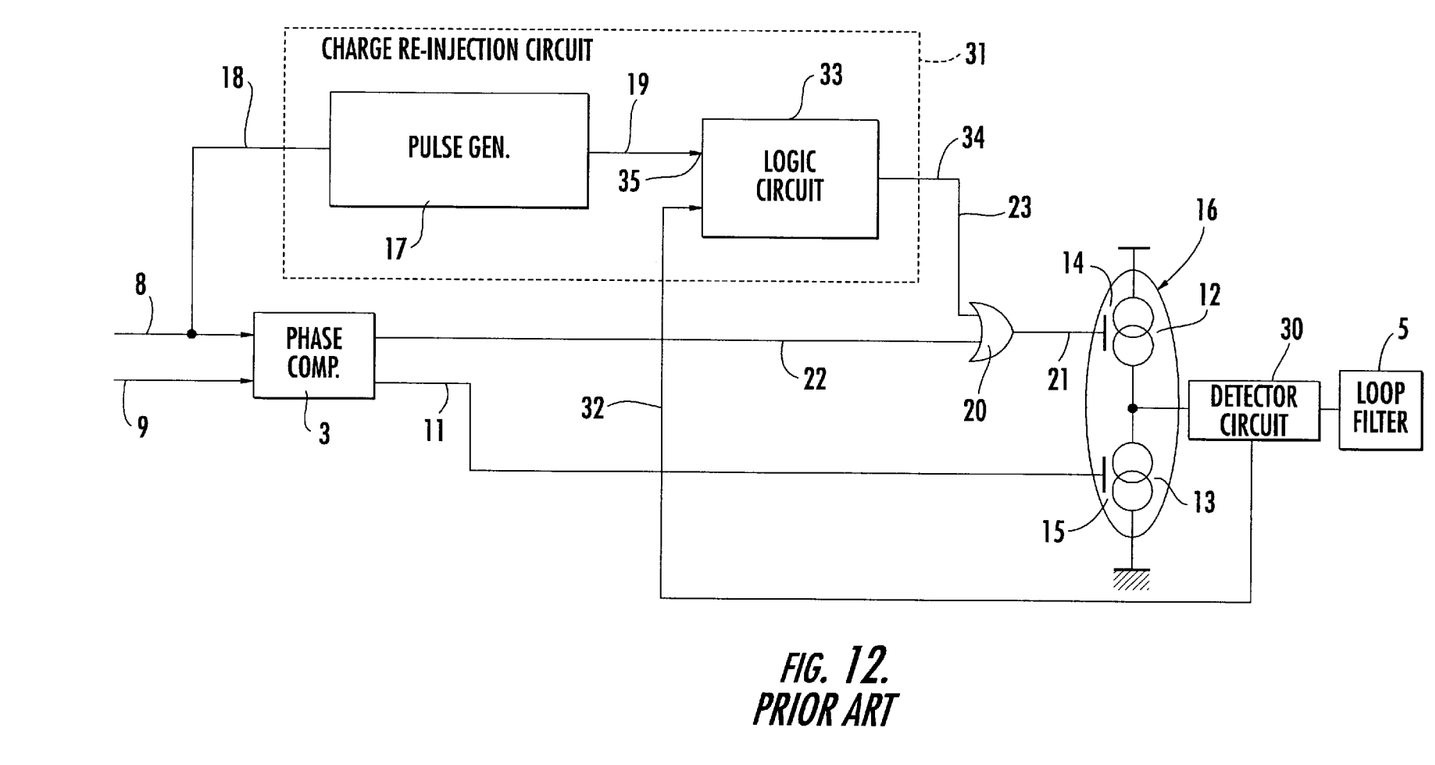
FIG. 12 illustrates a first embodiment of a portion of a phase locked loop comprising a charge re-injection time limiter circuit in accordance with the present invention.

In FIG. 12, the charge re-injection circuit 31 comprises a generator 17 of a pulse having a predetermined length q, as in the prior art. Instead of directly supplying the OR gate 20, the output 19 from the generator 17 supplies a first input 35 to a logic circuit 33. A second input to this logic circuit 33 is formed by the input 32 carrying the logic value at the output from the detector 30. An output 34 from the logic circuit 33 forms the output from the charge re-injection circuit 31. This output 34 is coupled to the first input 23 of the OR gate 20.

The operation of the logic circuit 33 is as follows. When the first input 35 receives the logic value 1 present at the output 19 from the pulse generator 17, for example, the output 34 from the circuit 33 takes a logic value 1, for example, commanding current to flow from the current generator 12 of the charge pump 16. After a reaction time, the generator 12 will pass current. The current passed by generator 12 will be detected by the detector 30.

Under the effect of this detection, the logic value at the output from the detector 30 will change and be set to a 1, for example. The result is that the logic value at the input 32 of the logic circuit 33 will also change. The circuit 33 is designed so that, in this case, the output 34 from this circuit will again take up in a stable fashion the logic value 0, for example, which commands the generator 12 to stop. The duration q of the pulse at the output from the re-injection circuit 31, as modified by the invention, is limited strictly to the time required to start up the current generator 12 and to the time needed to detect this start up.

Figure 9:
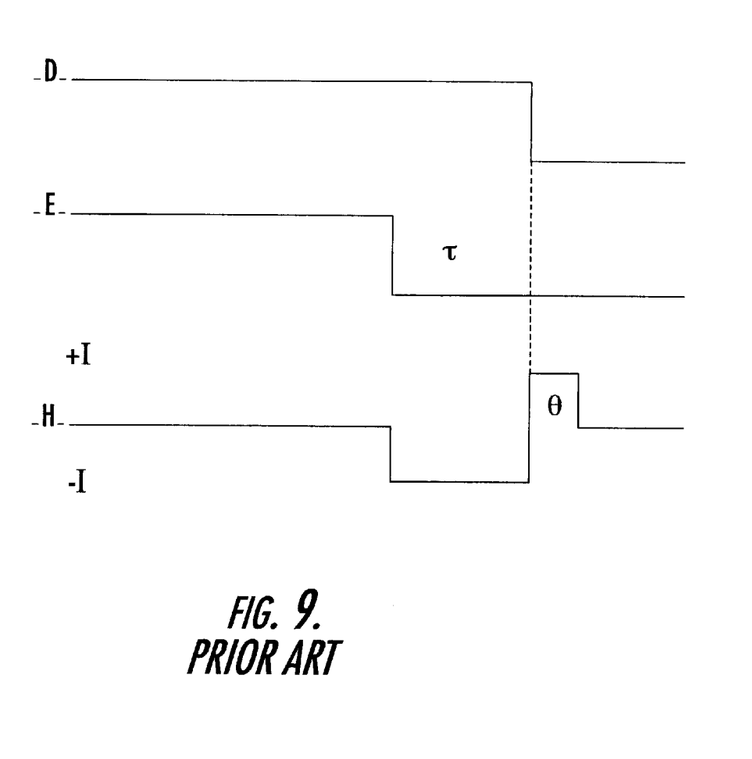
Figure 11:
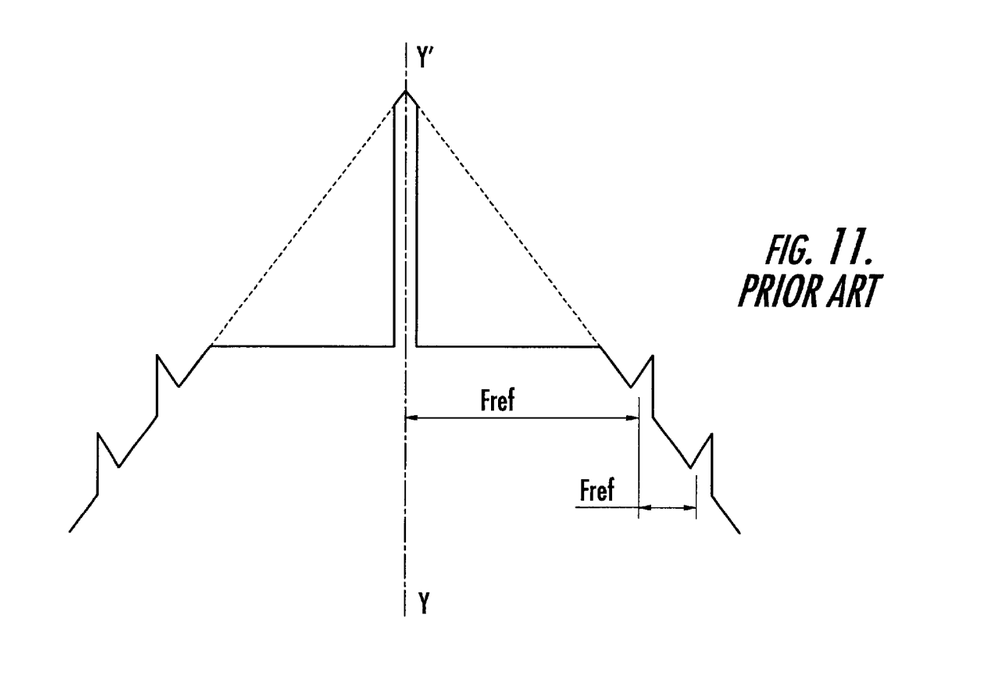
FIG. 11 illustrates the frequency spectrum at the output from the voltage controlled oscillator when the phase loop includes a charge re-injector circuit in accordance with the prior art.

The operation of the circuit shown in FIG. 12 is identical to that of the circuit shown in FIG. 7 in connection with FIGS. 8 to 10. However, because the duration of the re-injection pulse supplied by the re-injection circuit 31 is limited, the amplitude of the variation in the charge level due to the charge pump 16 is limited. Because of this, the amplitude of the parasitic peaks spaced by Fref is limited to a lower value. This spectrum at the output is as shown in FIG. 11, but with parasitic peaks at a lower level.

Figure 13:
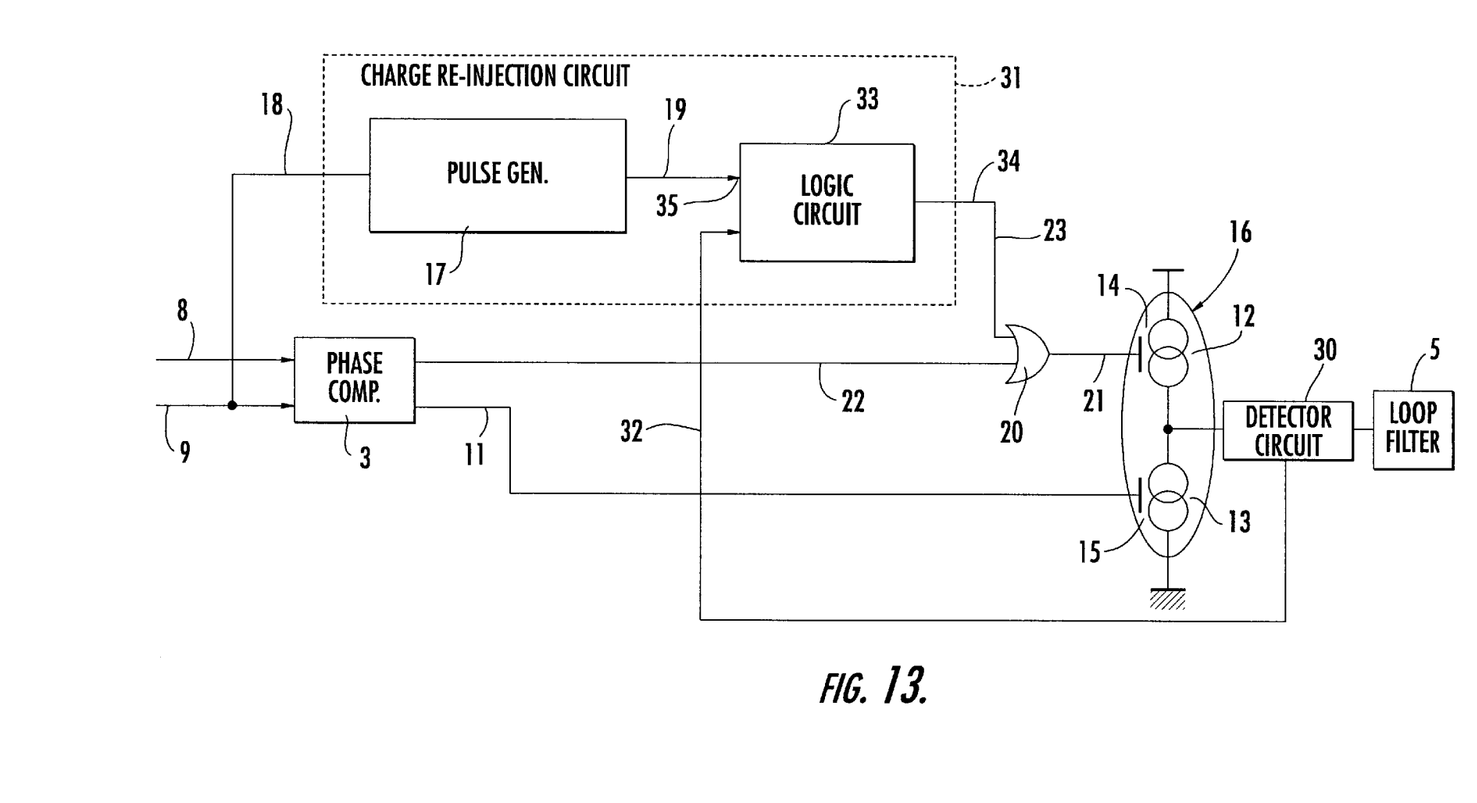
FIG. 13 illustrates a preferred embodiment of a portion of a phase locked loop comprising a charge re-injection time limiter circuit in accordance with the present invention.

A preferred embodiment of the portion of the phase locked loop around the phase comparator 3 is shown in FIG. 13. This embodiment is identical to that shown in FIG. 12 except for the input to the pulse generator 17. According to this embodiment, the input 18 to the pulse generator 17 does not receive the signal Fref but the signal $F_{VCO}$.

Figure 14:
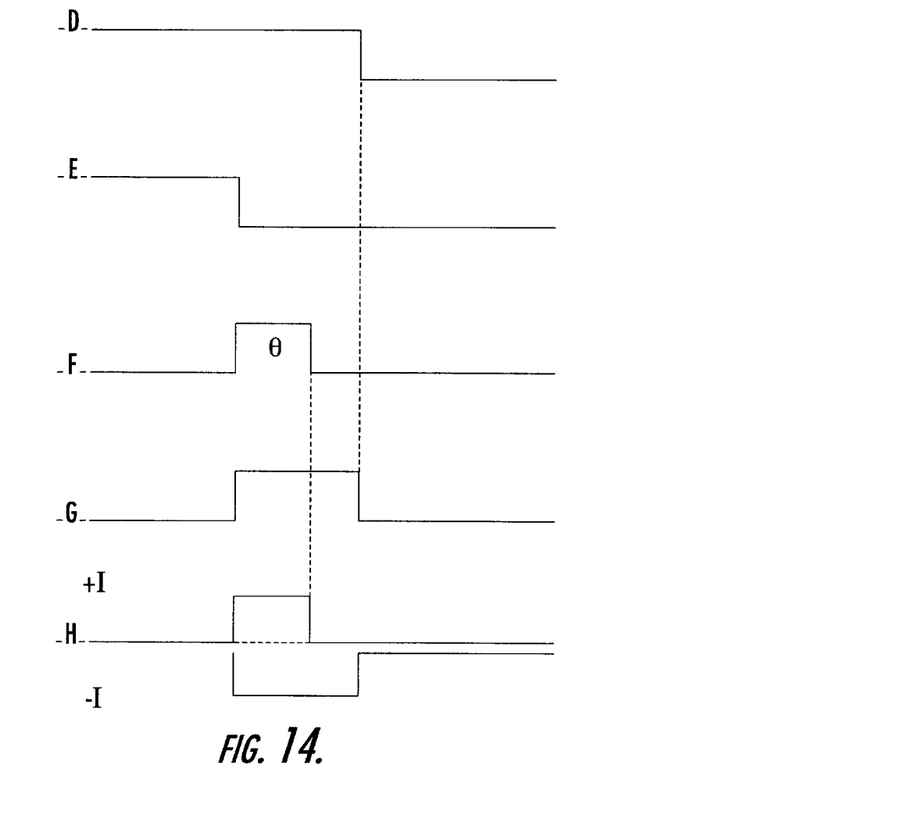
FIGS. 14 to 16 respectively illustrate changes in the signals over time in accordance with the present invention.

Under these conditions, the operation is that which will be described below in connection with FIGS. 14 to 16. For these figures, the same references are used as for FIGS. 3 to 5. In FIG. 14, the signal Fref (line D) is delayed with respect to signal $F_{VCO}$ (line E).

On the arrival of the falling edge of $F_{VCO}$ and according to this variation of the invention, the input 18 to the pulse generator 31 receives a logic signal which triggers an output having a logic value that triggers the current from the current generator 12 for a duration q corresponding to the duration of the pulse from the re-injection circuit 31. This is shown in FIG. 14 by the line F representing the command value for the up generator 12, whose command is equal to 1, for example, for the duration q beginning with the falling edge of $F_{VCO}$ represented on line E.

Parallel to this, the falling edge of the signal VCO will make the output 11 (down) from the comparator 3 positive. This output represented by line G will remain positive until the arrival of the falling front of the signal Fref. This positive output commands the flow of current from the current generator 13. The current, represented by line H, flowing through the current pump 16 is the algebraic sum of the opposed currents caused to flow by the generators 12 and 13. During the period of time q stating from the falling edge of $F_{VCO}$, this value is zero (broken line), then equal to −I for a period of time equal to the time separating the falling edges of $F_{VCO}$ and Fref reduced by the time q of the duration of the pulse 31.

Figure 15:
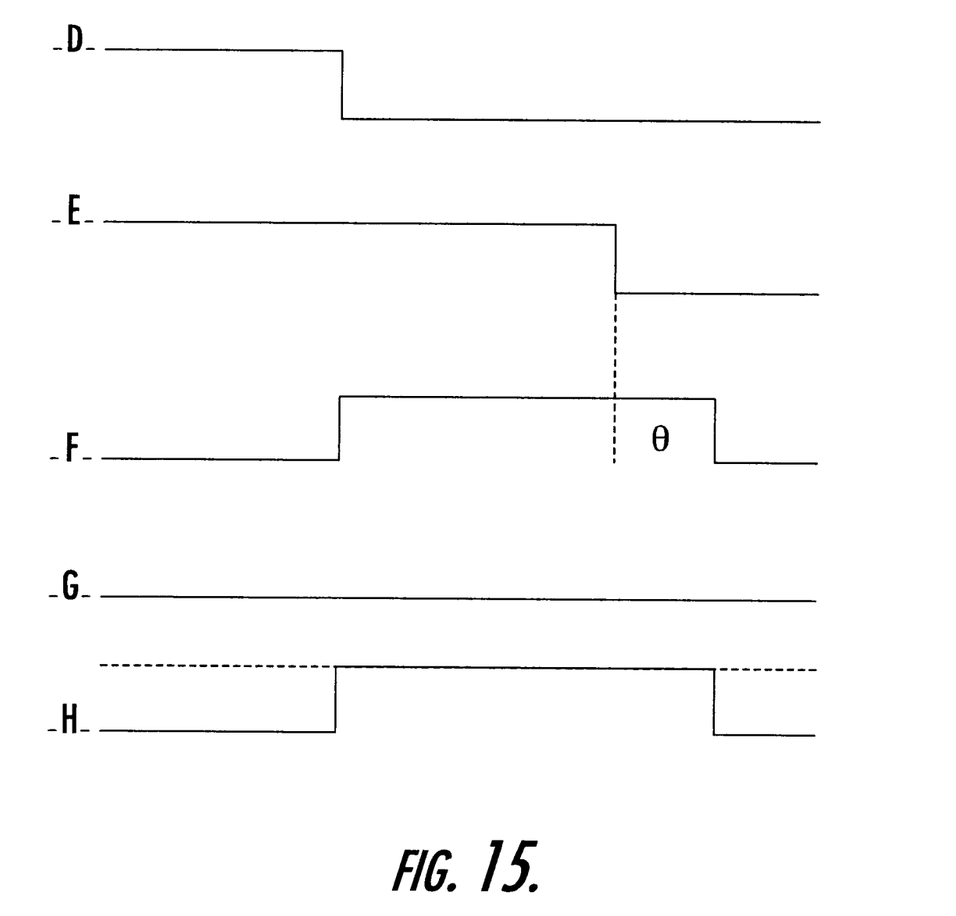
Figure 16A:
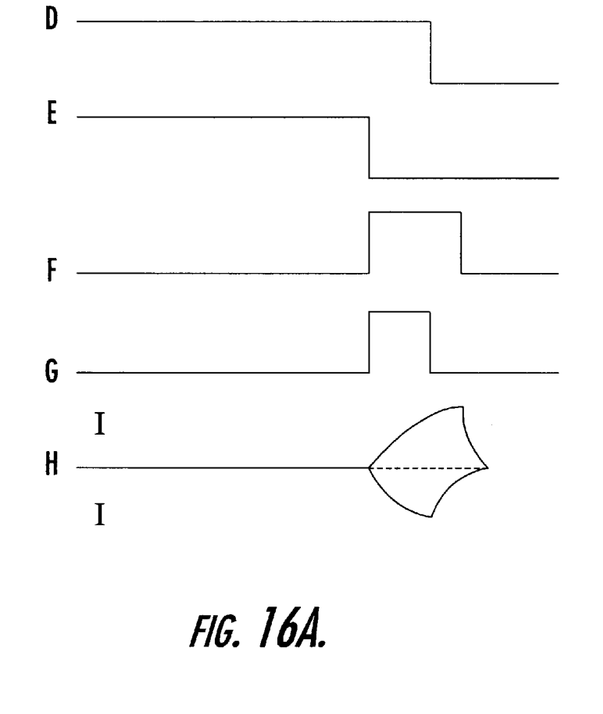
Figure 16B:
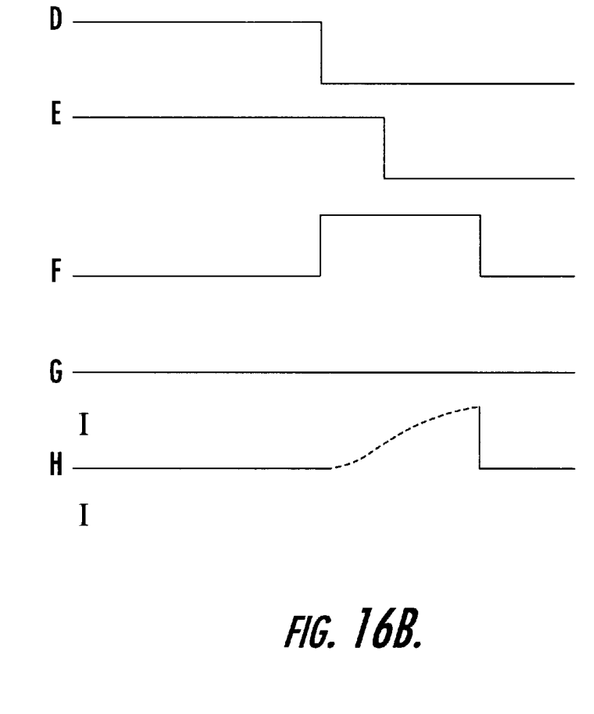

In FIG. 15, the operation of the device shown in FIG. 13 when the signal $F_{VCO}$ (line E) is phase delayed is compared with the signal Fref (line D). The arrival of the falling edge of Fref triggers the passage to 1 of the output 10 (up) of the comparator 3 (line F). The command of the generator 12 is positive and remains so (line F) until the arrival of the falling edge of the signal $F_{VCO}$. On the arrival of this edge, the output 10 goes back to 0, which is shown by the broken line F. However, the arrival of the falling edge of the signal $F_{VCO}$ triggers the pulse from the generator 31 for a period of time q. The result is that the other input 23 of the OR gate 20 becomes positive at the moment when the input 22 goes back to 0. Under these conditions, the output 21 from the OR gate 20 remains at 1 and the generator (up) 12 continues to pass current.

The output 11 represented by line G (down) from the comparator 3 remains at 0. The result is that the generator 13 does not pass current. Under these conditions, the value of the current flowing through the pump 16, represented by line H, is equal to +I for a period of time equal to the period of time separating the falling edges of the signals Fref and $F_{VCO}$ increased by the duration of the pulse q supplied by the pulse generator 31.

It should be noted that in the case of FIGS. 14 and 15, the phase differences between Fref and $F_{VCO}$ are greater than the duration q of the re-injection pulse from the re-injection circuit 31. The transient conditions have therefore been ignored. These difference values, greater than the duration of the re-injection pulse correspond to an imbalance from the charge pump. It can be seen that in the case where there is an imbalance, the mean value of the charge variation, which is equal to the value of the current I flowing through the charge pump multiplied by the flow time, is unchanged in comparison with the prior art since in one case (FIG. 14) the duration of the flow is reduced by the duration q, and in the other case (FIG. 15) this duration of flow is increased by q.

Contrary to this, in the case of imbalance of the charge pump, that is to say when the phase displacement between Fref and $F_{VCO}$ is less than the duration q, the transient conditions can no longer be ignored. The cases correspond to FIGS. 14 and 15, but with phase displacements less than the duration of the re-injection pulse, have been shown in FIG. 16 in parts a and b respectively. It can be seen from line H that the current I from the pump 16 remains zero or quasi-zero. Under these conditions the amplitudes of the lateral lines (FIGS. 6 and 11) are offset, one with respect to the other, by Fref or multiples of Fref.

The following results have been obtained in the following cases. These results have been obtained for a precise VCO gain, a precise current value I, a precise loop filter, a precise divider 7 and a precise value for Fref. The result is that the improvements observed are not directly transposable to other circuits having different values. However, the application of the present invention ought to provide improvements.

The first case is a circuit without re-injection as shown in FIG. 2, i.e., a prior art circuit without re-injection. In this case, the amplitude of the modulation lines spaced by Fref is limited by leaks from the charge pump. For example, for a leak (current case) of one nano-amp, the first line is located at −87.5 dB with respect to the central line $F_{VCO}$. However, as indicated above, because of the absence of control immediately around the frequency $F_{VCO}$, there is strong phase noise around $F_{VCO}$ (FIG. 6).

A second case is the re-injection on the up current generator triggered by a falling edge of Fref for a fixed re-injection duration of 20 nanoseconds corresponds to 5 times the minimum re-injection time. Reference is directed to FIG. 7, which is a prior art circuit with re-injection. The first line is at −68 dBc, and therefore at a higher level than in the previous case. Contrary to this case, the phase noise immediately around $F_{VCO}$ is greatly reduced.

A third case is with respect to the circuit according to the first embodiment of the invention with a re-injection duration limiter. The injection is carried out on a falling edge of the frequency Fref. Without leakage from the charge pump, the first line is at −96 dBc. With leakage from the charge pump of 1 nano-amp, the first line is at −85.7 dBc.

Yet another case is with respect to the circuit according to the second embodiment of the invention with a re-injection duration limiter. The injection is carried out on a falling edge of $F_{VCO}$. With a leakage from the pump of 1 nano-amp and an imbalance of 20% between the currents flowing through generators 12 and 13, the first line is at −85.7 dBc. With a leakage from the pump of 1 nano-amp and an imbalance between the currents flowing through generators 12 and 13 of 50%, the first line is at −85.6 dBc. Hence, in the preferred embodiment of the invention with current values (1 nano-amp) of leakage current and an imbalance of 20% between the currents flowing through the two generators 12, 13 of the charge pump 16, the level of the first parasitic line is at 18 dB below re-injection circuits according to the prior art.

Figure 17:
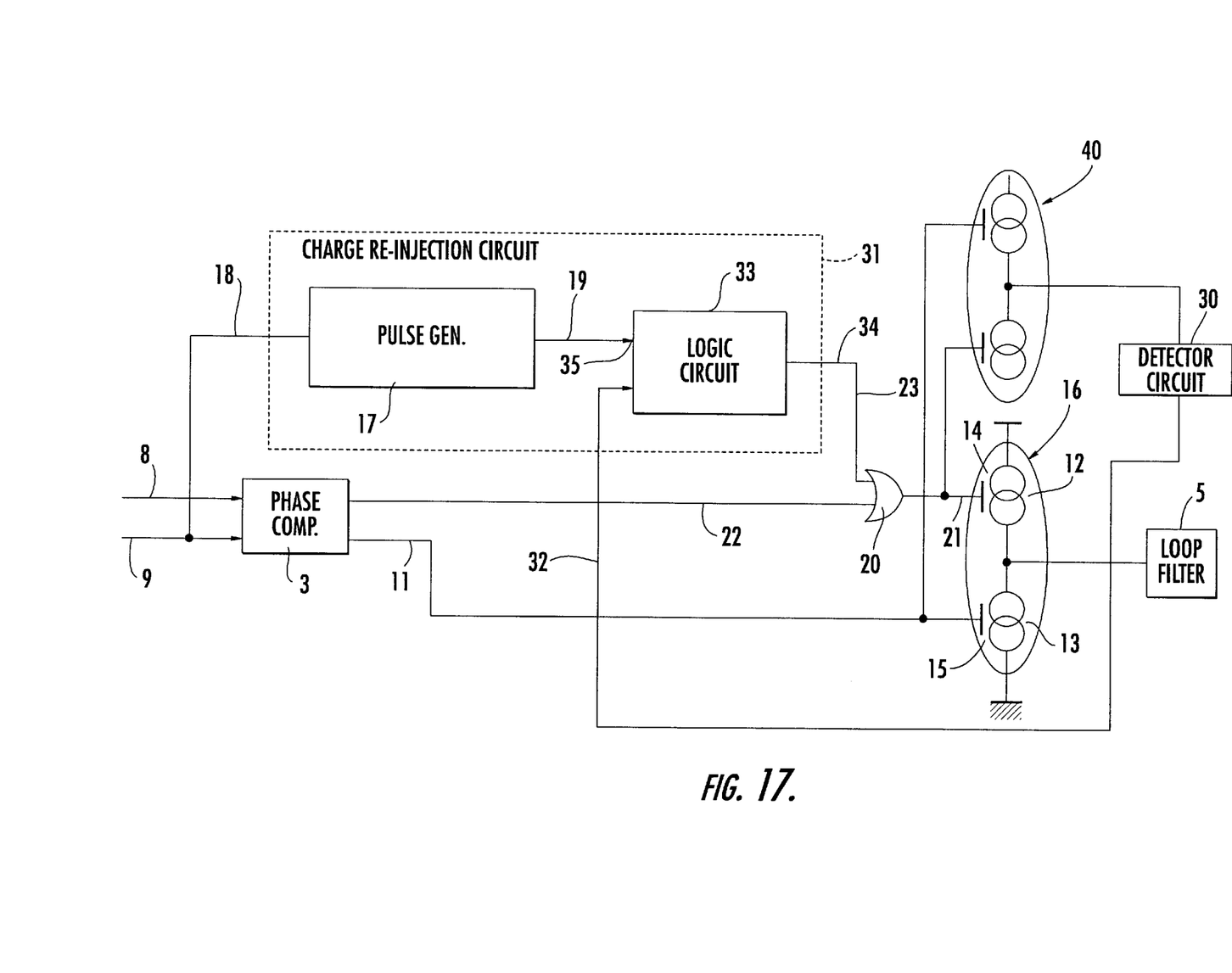
FIG. 17 illustrates another embodiment of the circuit illustrated in FIG. 12 and the circuit illustrated in FIG. 13.

An embodiment of the invention with an additional current generator for the detection is shown in FIG. 17. This embodiment variation is a variation of the circuit shown in FIG. 13. It is applicable under the same conditions as the circuit shown in FIG. 12.

According to this variation, the circuit comprises an additional charge pump 40. This additional charge pump receives the output from the OR gate 21 and the output 11 from the comparator 3. The detector 30 receives the current at the output from the additional pump 40. This embodiment, as indicated above, does not interfere with the normal operation of the phase loop.

In the descriptions and explanations above, it was assumed that the control gradient of the oscillating circuit 6 was positive. An increase in control voltage corresponds to an increase in the value of the output frequency. The invention is also applicable to oscillators with a negative That which is claimed is:

1. A phase locked loop for a voltage controlled oscillator comprising:
a charge pump;
a phase comparator having a first input for receiving a reference frequency signal and a second input for receiving a frequency signal from the voltage controlled oscillator, and a first output for supplying a first logic pulse to command said charge pump;
a charge re-injection circuit having an input connected to the second input of said phase comparator for receiving the frequency signal, and an output for supplying a second logic pulse to command said charge pump; and
a current detector having a threshold representative of a current supplied by said charge pump, said current detector having an input connected to an output of said charge pump, and an output for applying a logic output pulse to said charge re-injection circuit for adjusting duration of the second logic pulse.

2. A phase locked loop according to claim 1, wherein said charge re-injection circuit comprises:
a pulse generator having an input forming the input of said charge re-injection circuit; and
a logic circuit having a first input connected to an output of said pulse generator, a second input connected to the output of said current detector, and an output forming the output of said charge re-injection circuit.

3. A phase locked loop according to claim 1, further comprising a logic gate having a first input connected to the output of said charge re-injection circuit, a second input connected to the first output of said phase comparator, and an output connected to an input of said charge pump.

4. A phase locked loop according to claim 3, wherein said logic gate comprises an OR logic gate.

5. A phase locked loop according to claim 3, wherein said charge pump comprises a first current generator and a second current generator connected thereto, said first current generator having an input connected the output of said logic gate, and said second current generator having an input connected to a second output of said phase comparator.

6. A phase locked loop according to claim 1, further comprising a loop filter having an input connected to the output of said current detector, and an output connected to the voltage controlled oscillator.

7. A phase locked loop according to claim 1, wherein said pulse generator generates a pulse having a duration corresponding to a time required to start-up said charge pump and a time needed to detect this start-up by said current detector.

8. A phase locked loop according to claim 1, further comprising a second charge pump having a first input connected to the output of said logic gate and a second input connected to a second output of said phase comparator.

9. A phase locked loop comprising:
a voltage controlled oscillator;
a charge pump for providing a current to said voltage controlled oscillator;
a phase comparator having a first input for receiving a reference frequency signal and a second input for receiving a frequency signal from said voltage controlled oscillator, and a first output for supplying a first logic pulse to command said charge pump;
a charge re-injection circuit having an input connected to the second input of said phase comparator for receiving the frequency signal, and an output for supplying a second logic pulse to command said charge pump;
a logic gate having a first input connected to the output of said charge re-injection circuit, a second input connected to the first output of said phase comparator, and an output connected to an input of said charge pump; and
a current detector having a threshold representative of the current supplied by said charge pump, said current detector having an input connected to an output of said charge pump and an output for applying a logic output pulse to said charge re-injection circuit for adjusting duration of the second logic pulse.

10. A phase locked loop according to claim 9, wherein said charge re-injection circuit comprises:
a pulse generator having an input forming the input of said charge re-injection circuit; and
a logic circuit having a first input connected an output of said pulse generator, a second input connected to the output of said current detector, and an output forming the output of said charge re-injection circuit.

11. A phase locked loop according to claim 10, wherein said pulse generator generates a pulse having a duration corresponding to a time required to start up said charge pump and a time needed to detect this start up by said current detector.

12. A phase locked loop according to claim 9, wherein said logic gate comprises an OR logic gate.

13. A phase locked loop according to claim 9, wherein said charge pump comprises a first current generator and a second current generator connected thereto, said first current generator having an input connected the output of said logic gate, and said second current generator having an input connected to a second output of said phase comparator.

14. A phase locked loop according to claim 9, further comprising a loop filter having an input connected to the output of said current detector, and an output connected to said voltage controlled oscillator.

15. A phase locked loop according to claim 9, further comprising a second charge pump having a first input connected to the output of said logic gate and a second input connected to a second output of said phase comparator.

16. A phase locked loop comprising:
a voltage controlled oscillator;
a first charge pump for providing a first current to said voltage controlled oscillator;
a second charge pump for providing a second current;
a phase comparator having a first input for receiving a reference frequency signal and a second input for receiving a frequency signal from said voltage controlled oscillator, and a first output for supplying a first logic pulse to command said first and second charge pumps;
a charge re-injection circuit having an input connected to the second input of said phase comparator for receiving the frequency signal, and an output for supplying a second logic pulse to command said first and second charge pumps;
a logic gate having a first input connected to the output of said charge re-injection circuit, a second input connected to the first output of said phase comparator, and an output connected to said first and second charge pumps; and
a current detector having a threshold representative of the current supplied by said first and second charge pumps, said current detector having an input connected to an output of said second charge pump and an output for applying a logic output pulse to said charge re-injection circuit for adjusting duration of the second logic pulse.

17. A phase locked loop according to claim 16, wherein said charge re-injection circuit comprises:

a pulse generator having an input forming the input of said charge re-injection circuit; and a logic circuit having a first input connected an output of said pulse generator, a second input connected to the output of said current detector, and an output forming the output of said charge re-injection circuit.

18. A phase locked loop according to claim 17, wherein said pulse generator generates a pulse having a duration corresponding to a time required to start up said charge pump and a time needed to detect this start up by said current detector.

19. A phase locked loop according to claim 16, wherein said logic gate comprises an OR logic gate.

20. A phase locked loop according to claim 16, wherein said first charge pump comprises a first current generator and a second current generator connected thereto, said first current generator having an input connected the output of said logic gate, and said second current generator having an input connected to a second output of said phase comparator.

21. A phase locked loop according to claim 16, wherein said second charge pump comprises a first current generator and a second current generator connected thereto, said first current generator having an input connected to the second output of said phase comparator, and said second current generator having an input connected to the output of said logic gate.

22. A phase locked loop according to claim 16, further comprising a loop filter connected between an output of said first charge pump and an input of said voltage controlled oscillator.

23. A method of reducing parasitic interference supplied by a voltage controlled oscillator, the method comprising:

comparing a phase between a reference frequency signal and a frequency signal from the voltage controlled oscillator;

generating a first logic pulse to command a charge pump based upon comparing the phase;

generating a second logic pulse to command the charge pump based upon the frequency signal from the voltage controlled oscillator;

detecting a current supplied by the charge pump and comparing the detected current to a threshold for generating a logic output pulse; and adjusting duration of the second logic pulse based upon generation of the logic output pulse.

24. A method according to claim 23, wherein the voltage controlled oscillator is connected to a phase locked loop.

25. A method according to claim 24, wherein adjusting duration of the second logic pulse is based upon an instantaneous reaction time of the phase locked loop.

26. A method according to claim 24, wherein generating the second logic pulse comprises:

generating a pulse based upon the frequency signal from the voltage controlled oscillator; and applying the generated pulse and the logic output pulse to a logic circuit for generating the second logic pulse.

27. A method according to claim 26, wherein the pulse is generated having a duration corresponding to a time required to start-up the charge pump and a time needed to detect a current supplied by the charge pump.

28. A method according to claim 23, further comprising:

applying the first logic pulse to a first input of a logic gate;

applying the second logic pulse to a second input of the logic gate for commanding the charge pump based upon the first and second logic pulses.

29. A method according to claim 28, wherein the logic gate comprises an OR logic gate.

30. A method according to claim 28, wherein the charge pump comprises a first current generator and a second current generator connected thereto, the first current generator having an input connected the output of the logic gate, and the second current generator having an input for receiving a signal based upon comparing the phase between the reference frequency signal and the frequency signal from the voltage controlled oscillator.

31. A method according to claim 23, further comprising filtering an output of the charge pump.

* * * * *

UNITED STATES PATENT AND TRADEMARK OFFICE
CERTIFICATE OF CORRECTION

PATENT NO.    : 6,388,531 B1  Page 1 of 1
DATED         : May 14, 2002
INVENTOR(S)   : Philippe Sirito-Olivier It is certified that error appears in the above-identified patent and that said Letters Patent is hereby corrected as shown below:

Column 7,
Line 19, delete "stating" insert -- starting --
Line 25, delete "delayed is compared" insert -- delayed compared --

Column 9,
Line 42, delete "connected the" insert -- connected to the --

Column 10,
Line 18, delete "connected an" insert -- connected to an --
Line 33, delete "connected the" insert -- connected to the --

Column 11,
Line 23, delete "connected the" insert -- connected to the --

Column 12,
Line 35, delete "connected the" insert -- connected to the --

Signed and Sealed this

Twenty-first Day of January, 2003

JAMES E. ROGAN
*Director of the United States Patent and Trademark Office*